United States Patent
Kang et al.

(10) Patent No.: US 9,627,388 B2
(45) Date of Patent: Apr. 18, 2017

(54) MEMORY SYSTEM HAVING OVERWRITE OPERATION CONTROL METHOD THEREOF

(71) Applicants: Hee-Woong Kang, Suwon-si (KR); Suejin Kim, Gwangmyeong-si (KR); Heewon Lee, Suwon-si (KR)

(72) Inventors: Hee-Woong Kang, Suwon-si (KR); Suejin Kim, Gwangmyeong-si (KR); Heewon Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 131 days.

(21) Appl. No.: 14/731,003

(22) Filed: Jun. 4, 2015

(65) Prior Publication Data
US 2015/0364199 A1 Dec. 17, 2015

(30) Foreign Application Priority Data

Jun. 11, 2014 (KR) .................. 10-2014-0070959

(51) Int. Cl.
*G11C 29/00* (2006.01)
*H01L 27/108* (2006.01)
(Continued)

(52) U.S. Cl.
CPC .... *H01L 27/10823* (2013.01); *G06F 11/1048* (2013.01); *G11C 11/5635* (2013.01); *G11C 11/5671* (2013.01); *G11C 16/0466* (2013.01); *G11C 29/52* (2013.01); *H01L 23/528* (2013.01); *H01L 27/10814* (2013.01); *H01L 28/40* (2013.01); *G11C 29/42* (2013.01); *G11C 2029/0411* (2013.01); *H01L 27/11582* (2013.01); *H01L 2924/0002* (2013.01)

(58) Field of Classification Search
CPC ............ G11C 11/5635; G11C 11/5671; G11C 2029/0411; G11C 29/42; G11C 29/52; G11C 16/0466; G11C 16/14
See application file for complete search history.

(56) References Cited

U.S. PATENT DOCUMENTS 5,392,241 A * 2/1995 Butler .................. G11C 7/06
                                                   365/189.06
7,483,324 B2    1/2009 Blacquiere et al.
(Continued)

FOREIGN PATENT DOCUMENTS

JP          3812933 B2      6/2006
JP          2011203771      10/2011
(Continued)

*Primary Examiner* — David Ton
(74) *Attorney, Agent, or Firm* — Volentine & Whitt, PLLC

(57) ABSTRACT

The memory system has an overwrite operation and an operation control method thereof. A nonvolatile memory device has a plurality of memory blocks including a plurality of memory cells stacked in a direction perpendicular to a substrate. When data of memory cells connected to a word line of a selected memory block is read, the need of reclaim is determined based on an error bit level of the read data. In the case that memory cells having an erase state among the memory cells connected to the word line become a soft program state, the read data is overwritten in the memory cells connected to the word line of the selected memory block.

20 Claims, 16 Drawing Sheets

(51) Int. Cl.
*G11C 11/56* (2006.01)
*G11C 29/52* (2006.01)
*H01L 23/528* (2006.01)
*H01L 49/02* (2006.01)
*G11C 16/04* (2006.01)
*G06F 11/10* (2006.01)
*G11C 29/42* (2006.01)
*G11C 29/04* (2006.01)
*H01L 27/11582* (2017.01)

(56) References Cited

U.S. PATENT DOCUMENTS

| | | | |
|---|---|---|---|
| 7,558,905 B2 | 7/2009 | Sinclair et al. | |
| 7,679,133 B2 | 3/2010 | Son et al. | |
| 7,697,359 B2 | 4/2010 | Lee | |
| 7,822,791 B2 | 10/2010 | Chu | |
| 7,859,932 B2 | 12/2010 | Mokhlesi | |
| 8,176,387 B2 * | 5/2012 | Ohyama | G06F 11/1068 365/200 |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,689,082 B2 | 4/2014 | Oh et al. | |
| 2004/0170060 A1 | 9/2004 | Ishimoto | |
| 2006/0149891 A1 | 7/2006 | Rudelic | |
| 2009/0161466 A1 | 6/2009 | Hamilton et al. | |
| 2010/0332736 A1 | 12/2010 | Lim et al. | |
| 2011/0066899 A1 | 3/2011 | Kang et al. | |
| 2011/0233648 A1 | 9/2011 | Seol et al. | |
| 2013/0198440 A1 * | 8/2013 | Oh | G11C 11/5628 711/103 |

FOREIGN PATENT DOCUMENTS

KR 1020130013574 A 2/2013
KR 1020130037555 A 4/2013

* cited by examiner

MEMORY SYSTEM HAVING OVERWRITE OPERATION CONTROL METHOD THEREOF

CROSS-REFERENCE TO RELATED APPLICATIONS

This U.S. non-provisional patent application claims priority under 35 U.S.C. §119 of Korean Patent Application No. 10-2014-0070959, filed on Jun. 11, 2014, the entire contents of which are hereby incorporated by reference.

BACKGROUND OF THE INVENTION

The inventive concept relates to a semiconductor memory device, and more particularly, to a memory system based on a nonvolatile semiconductor memory and an operation control method thereof.

A semiconductor memory device may be classified into a volatile memory device such as a DRAM, a SRAM, etc. and a nonvolatile memory device such as an EEPROM, a FRAM, a PRAM, a MRAM, a flash memory, etc. A volatile memory device loses its stored data when its power is interrupted while a nonvolatile memory device retains its stored data even when its power is interrupted. A flash memory has advantages of a high programming speed, low power consumption, a high-capacity data storage, etc. Thus, a memory system including a flash memory is being widely used as data storage medium.

A flash memory device stores bit information by injecting charge into a conductive floating gate isolated by an insulating layer. However, because of a capacitive coupling problem that may exist between memory cells or between a memory cell and a select transistor (GSL, SSL), a conductive floating gate structure may be considered as a structure having a physical limit in high density integration. As an alternative to addressing a capacitive coupling issue between conductive floating gates, a charge trap flash (CTF) memory structure using an insulating layer such as $Si_3N_4$, $Al_2O_3$, HfAlO, HfSiO, etc. as a charge storage layer is being suggested.

A charge trap flash (CTF) memory device may be applied to a three-dimensional flash memory device to overcome a physical limit of high density integration. Because of a structural feature of using an insulating layer as a charge storage layer, in a charge trap flash (CTF) memory device, electrons or holes in a charge storage layer are rearranged or recombined after a program or erase operation and thereby threshold voltages of flash memory cells may be changed.

If threshold voltages of flash memory cells are changed due to a disturbance phenomenon in a read operation, a UECC (uncorrectable error correction code) may occur in the read data.

SUMMARY

Embodiments of the inventive concept provide a method of controlling a nonvolatile memory device having a plurality of memory blocks including a plurality of memory cells stacked in a direction perpendicular to a substrate. The method may include reading data of memory cells connected to a word line of a selected memory block; determining the necessity of reclaim based on an error bit level of the read data; and checking a soft program state level with respect to the memory cells connected to the word line, and then overwriting the read data in the memory cells connected to the word line of the selected memory block in the case that it is determined that the soft program state level does not go beyond a first setting range.

Embodiments of the inventive concept also provide a method of controlling a nonvolatile memory device having a plurality of memory blocks including a plurality of memory cells stacked in a direction perpendicular to a substrate. The method may include reading data written in memory cells connected to a word line of a first memory block; determining the necessity of reclaim based on an error bit level of the read data; checking a soft program state level with respect to memory cells having an erase state among memory cells connected to the word line, and then overwriting the read data in the memory cells connected to the word line of the first memory block in the case that it is determined that the soft program state level is within a first setting range; and writing the read data in a second memory block different from the first memory block in the case that it is determined that the soft program state level goes beyond the first setting range.

Embodiments of the inventive concept also provide a memory system. The memory system may include a nonvolatile memory device having a plurality of memory blocks including a plurality of memory cells stacked in a direction perpendicular to a substrate; and a memory controller having an overwriting manager. If data stored in memory cells connected to a selected word line of one memory block of the memory blocks is read to the memory controller and thereby it is determined that an error bit level of the read data needs a reclaim and if a soft program state level of the memory cells connected to the word line is checked and it is determined that the soft program state level is within a specific range as a result of the check, the overwriting manager controls the read data to be overwritten in the memory cells connected to the word line of the selected memory block as it is.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF PREFERRED EMBODIMENTS

Figure 1:
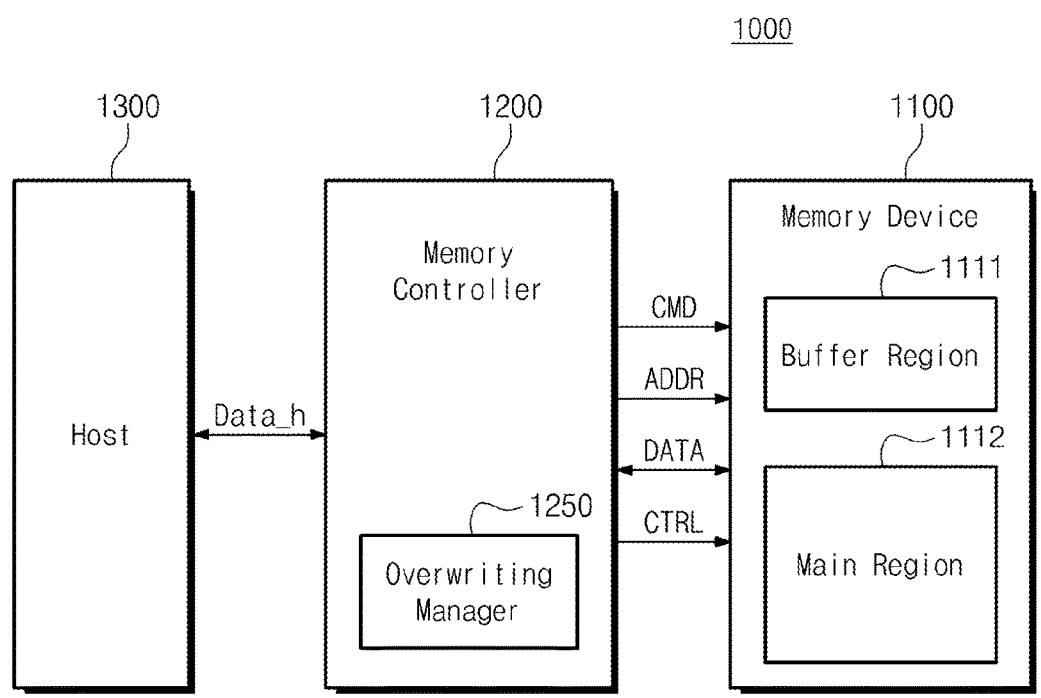
FIG. 1 is a block diagram illustrating a memory system in accordance with the inventive concept.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string further may includes at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory system in accordance with the inventive concept. Referring to FIG. 1, a memory system 1000 includes a memory device 1100 and a memory control 1200. The memory controller 1200 can be connected to a host 1300. The memory device 1100 is controlled by the memory controller 1200 and can perform operations (for example, read and program (write) operations) corresponding to a request of the memory controller 1200. The memory device 1100 includes a buffer region 1111 and a main region 1112.

The buffer region 1111 may be formed of a single level cell (SLC) buffer storing 1-bit data per cell. The main region 1112 may be formed by a multi level cell (MLC) region storing N-bit data per cell (N is an integer which is 2 or larger). Each of the buffer and main regions 1111 and 1112 may be formed by a multi level cell. In this case, a multi level cell of the buffer region 1111 may only perform a LSB program operation so that it operates like a single level cell.

Each of the buffer and main regions 1111 and 1112 may also be formed by a single level cell. The main region 1112 and the buffer region 1111 may be embodied by one memory device or a separate memory device. Data stored in the buffer region 1111 may be data provided from the outside by a write request of the host 1300.

The memory controller 1200 is connected between the memory device 1100 and the host 1300. The memory controller 1200 controls read and write operation with respect to the memory device 1100 in response to a request of the host 1300. The memory controller 1200 can receive host data Data_h and transmit data DATA to the memory device 1100. The memory controller 1200 may provide a command CMA, an address ADDR, data DATA, and a control signal CTRL. The memory controller 1200 manages a mapping table including a logical address LA and a physical address PA.

Referring to FIG. 1, the memory controller 1200 includes an overwriting manager 1250. The overwriting manage 1250 controls an overwrite operation in the memory controller 1200. The memory controller 1200 reads data of memory cells connected to a word line of a memory block selected in a read operation by the fixed unit. In this case, data being read by the fixed unit, in the case where memory cells are a SLC, becomes 1 page data quantity per one word line and in the case where memory cells are a 2-bit MCL, becomes 2 page data quantity per one word line.

The memory controller 1200 determines the necessity of reclaim based on an error bit level of data which has been read. The error bit level is detected through an ECC circuit (or ECC engine). When it is necessary to process a reclaim, the memory controller 1200 checks a soft program state level with respect to memory cells connected to the word line. In the case that it is determined that the soft program state level does not go beyond a first level range, the memory controller 1200 overwrites the data which has been read on the memory cells connected to the word line of the selected memory block. Herein, a read of the soft program state level may be performed on memory cells having an erase state among the memory cells connected to the word line. In the case that it is determined that the soft program state level goes beyond a first level range and exists within a second level range, the memory controller 1200 may perform a soft-erase on the memory cells connected to the word lines before overwriting the data which has been read.

Since the overwrite is to write error corrected data again in memory cells connected to a word line on which a data read is performed after correcting an error of deteriorated data, a physical address correspondingly mapped to a logical address of the memory blocks does not change. Thus, the overwrite operation may be performed while maintaining mapping in the mapping table as it is.

The overwrite operation may be performed by a full page program of a memory block unit or a full page program of a word line unit. The full page program means to program all the pages included in an entire block.

The nonvolatile memory device may have a memory cell array defining a three-dimensional NAND flash memory device.

In an embodiment of the inventive concept, an error bit level of data read when determining the need of reclaim may be an error bit level in an error correctable range. In the memory system 1000 of FIG. 1, since the number of uses of a new memory block is reduced through an overwrite operation, the lifespan of a memory device is extended. Since reclaim is performed on deteriorated data without change of a mapping table, a reclaim processing speed increases.

Figure 2:
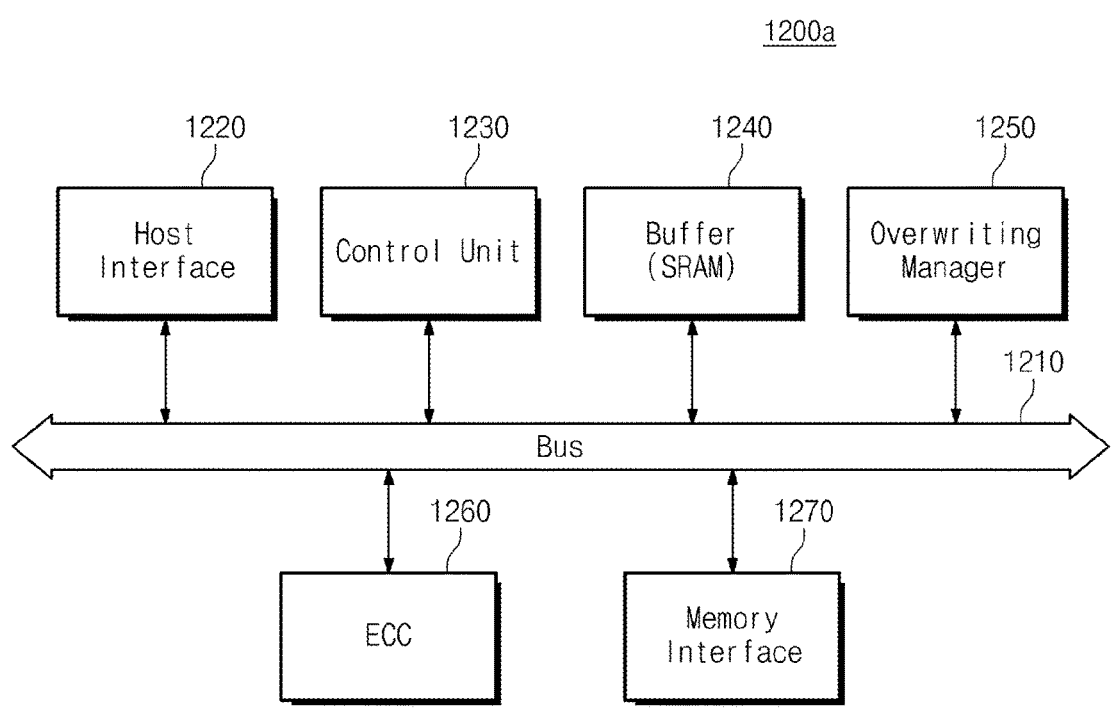
FIG. 2 is a block diagram illustrating a memory controller illustrated in FIG. 1.

FIG. 2 is a block diagram illustrating the memory controller illustrated in FIG. 1. Referring to FIG. 2, the memory controller 1200a includes a system bus 1210, a host interface 1220, a control unit 1230, a SRAM 1240, an overwriting manager 1250, an ECC unit 1260 and a memory interface 1270. The system bus 1210 provides a change among the host interface 1220, the control unit 1230, a SRAM 1240, the overwriting manager 1250, the ECC unit 1260 and the memory interface 1270.

The host interface 1220 can communicate with the host 1300 (refer to FIG. 1) according to a specific communication standard. The memory controller 1200 can communicate with the host 1300 through at least one of various communication standards such as a USB (universal serial bus), a MMC (multimedia card), a PCI (peripheral component interconnection), a PCI-E (PCI-express), an ATA (advanced technology attachment), a serial-ATA, a parallel-ATA, a SCSI (small computer small interface), an ESDI (enhanced small disk interface), an IDE (integrated drive electronics), and firewire.

The control unit 1230 receives host data Data_h and a command and can control an overall operation of the memory controller 1200. The SRAM 1240 may be used as at least one of an operation memory of an internal operation of the memory controller 1200, cache memory and a buffer memory.

As described in FIG. 1, in the case that memory cells having an erase state among memory cells connected to the word line are in a soft program state within the range of a first level, the overwriting manager 1250 overwrites the data which has been read on the memory cells connected to the word line of the selected memory block. The ECC unit 1260 performs an ECC-encoding operation on data being received from the host 1300 to generate coded data. The ECC unit 1260 performs an ECC-decoding operation on coded data being received from the memory device 1100 to generate original data. The ECC-encoding operation and the ECC-decoding operation are called an ECC operation. The memory interface 1270 interfaces with the memory device 1100. For example, the memory interface 1270 may include a NAND flash interface or a VNAND interface. The VNAND interface may be used in a three-dimensional NAND flash memory.

Figure 3:
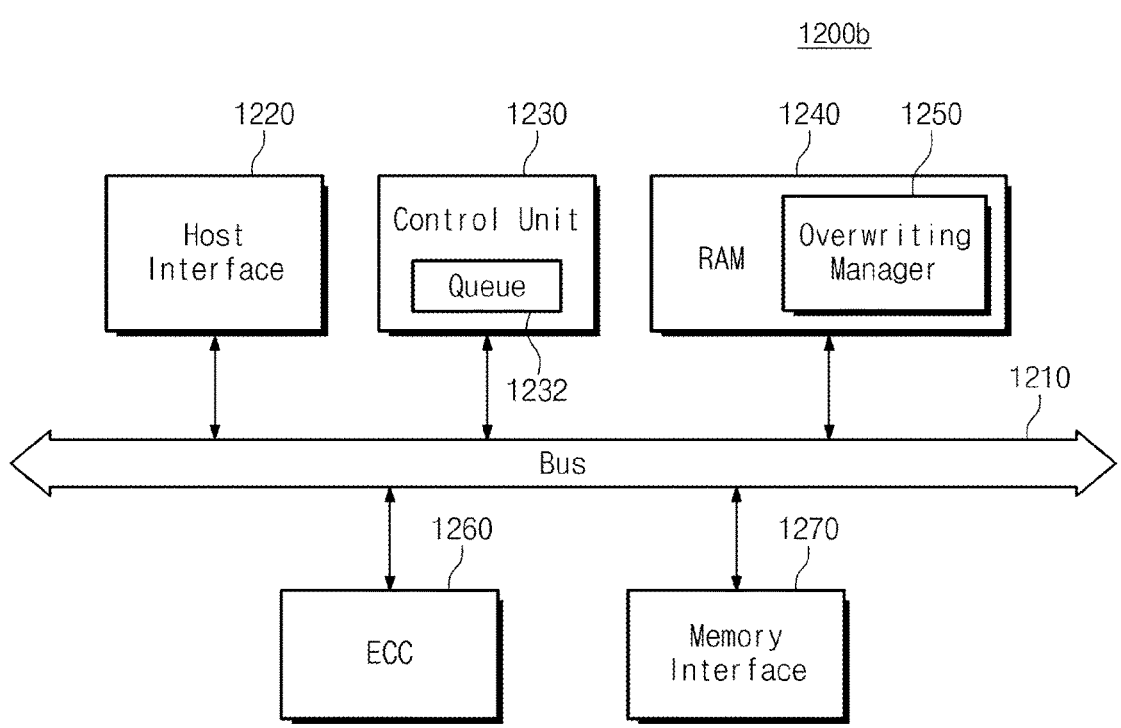
FIG. 3 is a block diagram illustrating another embodiment of the memory controller illustrated in FIG. 1.

FIG. 3 is a block diagram illustrating another embodiment of the memory controller illustrated in FIG. 1. Referring to FIG. 3, the memory controller 1200b includes a system bus 1210, a host interface 1220, a control unit 1230, a RAM 1240, an overwriting manager 1250, an ECC unit 1260 and a memory interface 1270. The control unit 1230 may include a reclaim queue 1232 for storing reclaim information. In FIG. 3, since the remaining constituent elements are the same as those in FIG. 2, descriptions of overlapped parts with the aforementioned embodiment are omitted.

Figure 4:
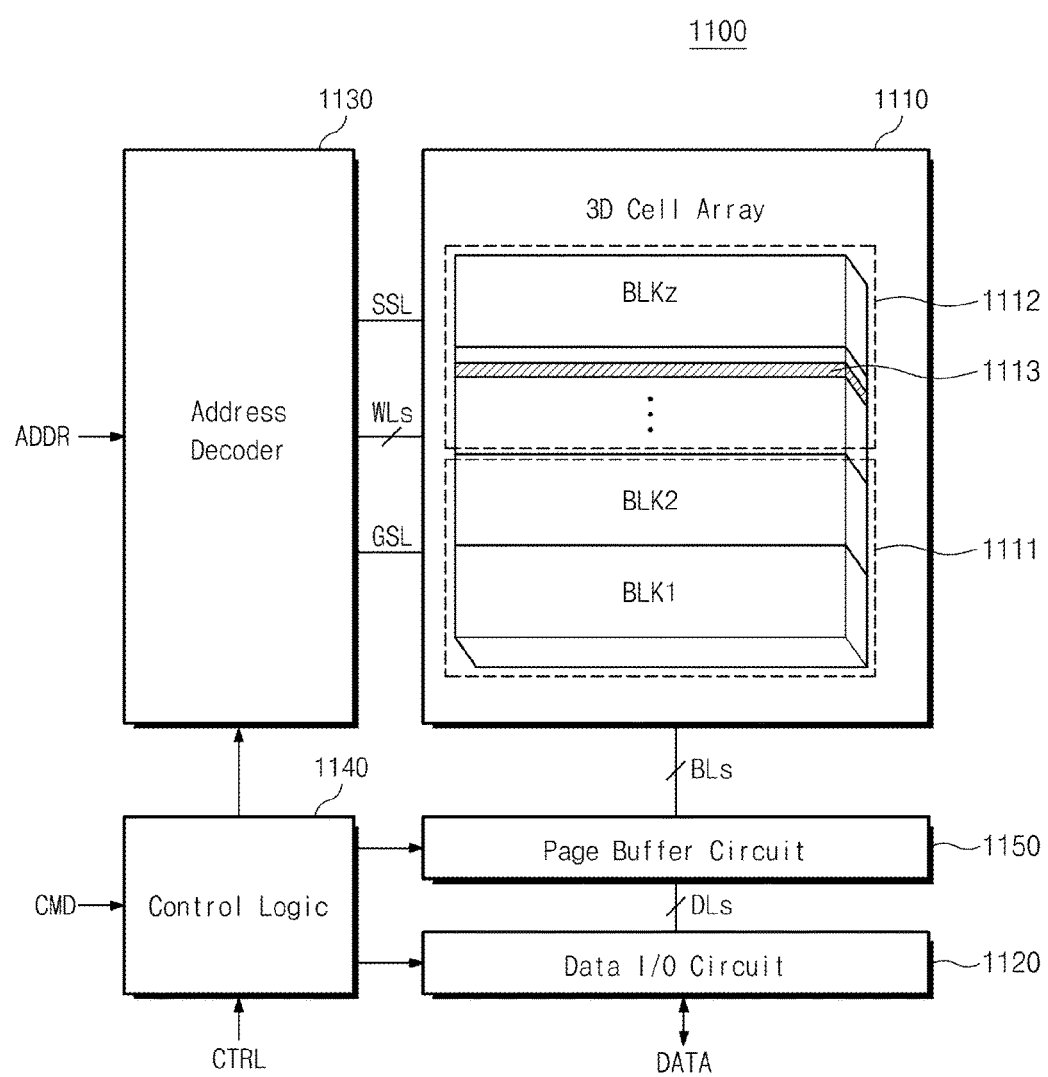
FIG. 4 is a block diagram illustrating a flash memory being used in the inventive concept.

The memory device 1100 in FIG. 1 can be applied to not only a flash memory having a 2-dimensional structure but also a flash memory having a 3-dimensional structure. FIG. 4 is a block diagram illustrating a flash memory being used in the inventive concept. The memory device 1100 in FIG. 4 illustrates a 3-dimensional flash memory. The memory device 1100 includes a 3-bit memory cell array 110, a data input/output circuit 1120, an address decoder 1130, a page buffer circuit 1150 and control logic 1140.

The 3-dimensional memory cell array 1110 includes a buffer region 1111 and a main region 1112. The 3-dimensional memory cell array 1110 includes a plurality of memory blocks BLK1~BLKz. Each of the buffer region 1111 and the main region 1112 may be formed by a plurality of memory blocks. Each of the memory blocks BLK1~BLKz includes a plurality of pages 1113. In case of a SLC, one page 1113 indicates one word line. In case of a 2-bit MLC, a LSB page and a MSB page correspond to one word line. Each memory block may have a 3-dimensional structure (or vertical structure). In a memory block having a 2-dimensional structure (or a horizontal structure), memory cells are formed in parallel to a substrate. However, in a memory block having a 3-dimensional structure, memory cells are formed in a direction perpendicular to the substrate. Each memory block forms an erase unit of the memory device 1100.

The data input/output circuit 1120 is connected to the three-dimensional memory cell array 1110 through the page buffer circuit 1150 connected to a plurality of bit lines BLs. The data input/output circuit 1120 may be input with data DATA from the outside or may output data DATA read from the three-dimensional memory cell array 1110. The page buffer circuit 1150 functions as a write driver in a write operation and functions as a data storage latch in a read operation.

The address decoder 1130 is connected to the three-dimensional memory cell array 1110 through a plurality of word lines WLs and select lines GSL and SSL. The address decoder 1130 is input with an address ADDR and selects a word line.

The control logic 1140 controls read, program and erase operations of the memory device 1100. For example, in a program operation, the control logic 1140 controls the address decoder 1130 so that a program voltage is provided to a select word line and controls the data input/output circuit 1120 and the page buffer circuit 1150 so that data is programmed.

Figure 5:
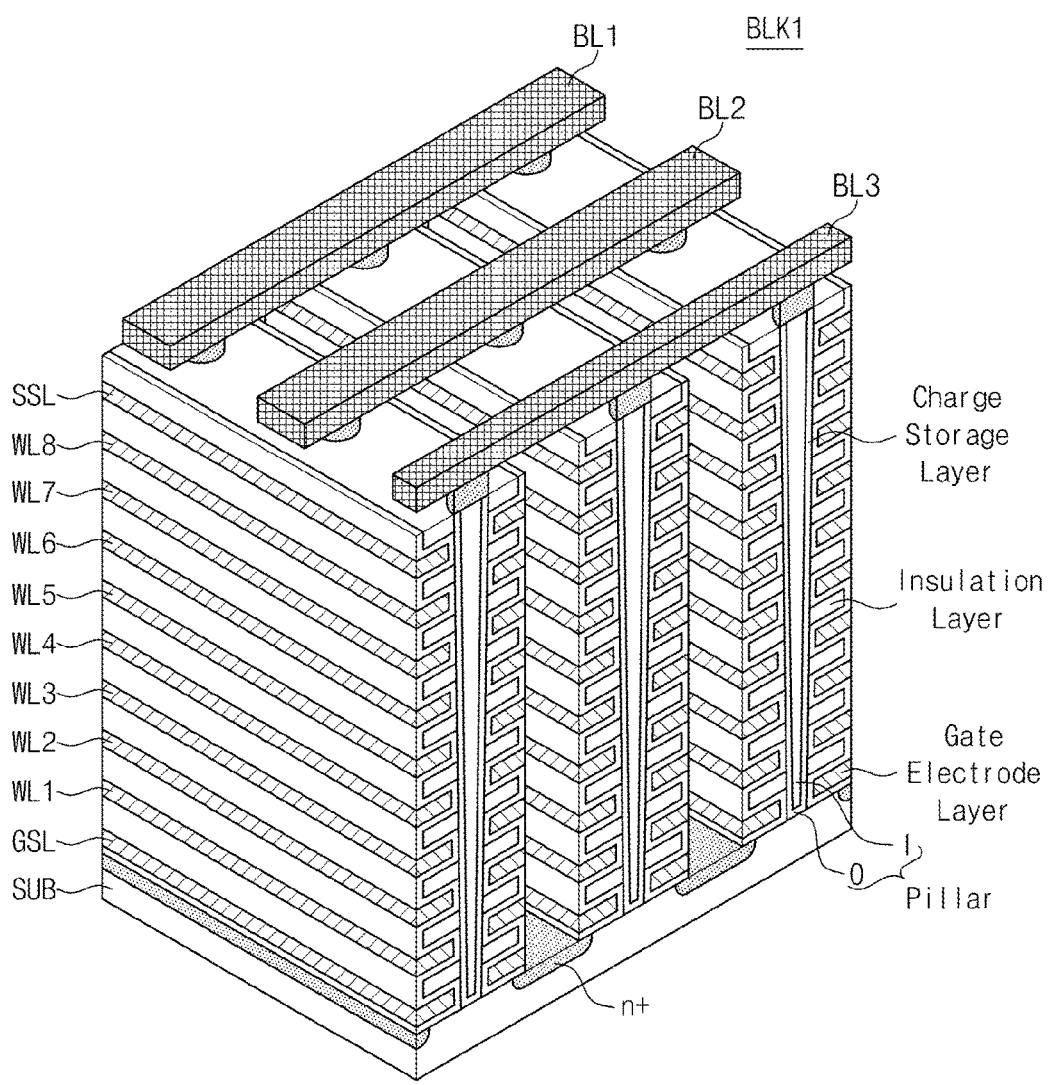
FIG. 5 is a perspective view illustrating a three-dimensional structure of a memory block BLK1 illustrated in FIG. 4.

FIG. 5 is a perspective view illustrating a three-dimensional structure of a memory block BLK1 illustrated in FIG. 4. Referring to FIG. 5, the memory block BLK1 is formed in a direction perpendicular to a substrate SUB. An n+ doping region is formed in the substrate SUB. A gate electrode layer and an insulation layer are alternately deposited on the substrate SUB. A charge storage layer may be formed between the gate electrode layer and the insulation layer.

The gate electrode layer and the insulation layer are vertically patterned to form a V character shape pillar. The pillar passes through the gate electrode layer and the insulation layer to be connected to the substrate SUB. An outer part O of the pillar may be formed by a channel semiconductor and an inner part I of the pillar may be formed by an insulation material such as silicon oxide.

The gate electrode layer of the memory block BLK1 may be connected to a ground select line GSL, a plurality of word lines WL1~WL8 and a string select line SSL. The pillar of the memory block BLK1 may be connected to a plurality of bit lines BL1~BL3. In FIG. 5, one memory block BLK1 has two select lines GSL and SSL, eight word lines WL1~WL8 and three bit lines BL1~BL3. However, the inventive concept is not limited thereto.

Referring to the memory block structure of FIG. 5, a capacitive coupling phenomenon between adjacent word lines may occur because a NAND string is vertically formed on a substrate and less occurs compared with a flash memory of a planar type. Thus, in a reclaim process being performed to prevent UECC, the structure of FIG. 5 can minimize or reduce a problem due to an overwriting.

Figure 6:
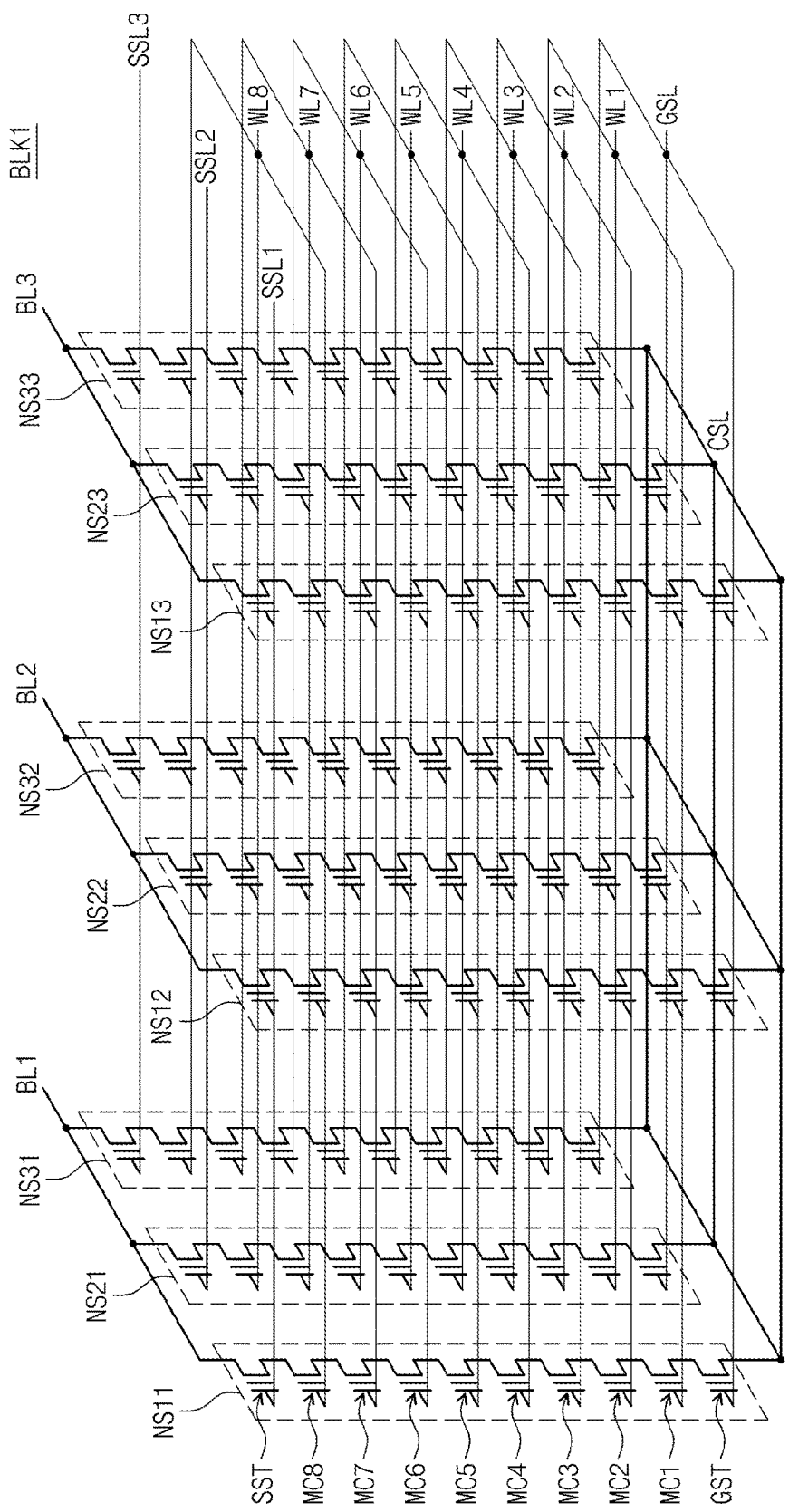
FIG. 6 is schematic diagram illustrating an equivalent circuit of the memory block BLK1 illustrated in FIG. 5.

FIG. 6 shows an equivalent circuit of the memory block BLK1 illustrated in FIG. 5. Referring to FIG. 6, NAND strings NS11~N533 are connected between bit lines BL1~BL3 and a common source line CSL. Each NAND string (for example, NS11) includes a string select transistor SST, a plurality of memory cells MC1~MC8 and a ground select transistor GST. String select transistors SST are connected to string select lines SSL1~SSL3 respectively. The memory cells MC1~MC8 are connected to respective word lines WL1~WL8. Ground select transistors GST are connected to a common source line CSL.

Word lines (for example, WL1) of the same height and the ground select line GSL are connected in common and the string select lines SSL1~SSL3 are separated from one another. In the case of programming memory cells (hereinafter they are referred to as page) that are included in the first word line WL1 and belong to the NAND strings NS11, NS12 and NS13, the first word line WL and a first select line SSL1 are selected.

Figure 7:
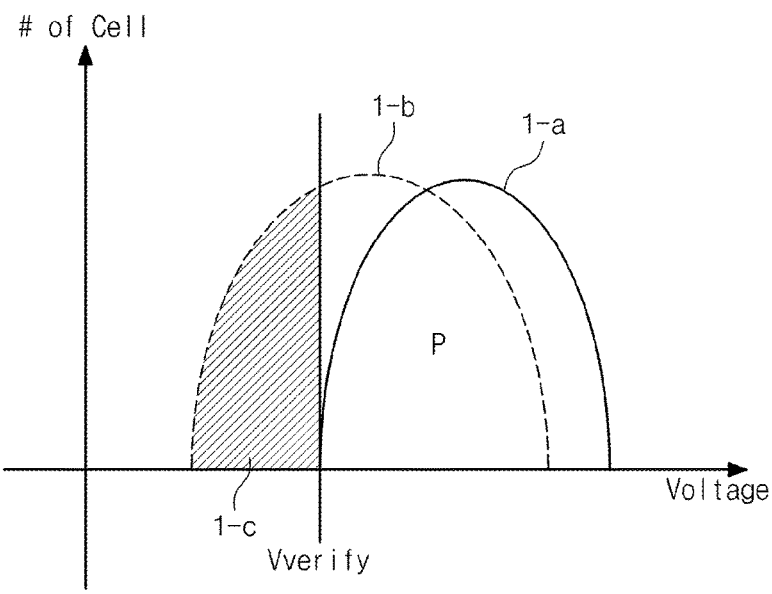
FIG. 7 is a drawing for explaining a charge loss phenomenon of a single level cell (SLC).

FIG. 7 is a drawing for explaining a charge loss phenomenon of a single level cell (SLC). Referring to FIG. 7, a charge loss phenomenon means that as time goes by, electrons trapped in a charge storage layer (for example, a floating gate or a tunnel oxide layer) of a flash memory device flow out of the charge storage layer. If the number of times that program and erase operations are repeated is increased, a tunnel oxide layer is deteriorated and thereby a charge loss phenomenon may occur more severely.

In FIG. 7, an x axis represents a voltage and a y axis represents the number of memory cells. A first program state distribution (1-*a*) represents a program state distribution immediately after a program operation (i.e., a state in which a charge loss phenomenon does not occur) and a second program state distribution (1-*b*) represents a program state distribution after a charge loss phenomenon occurs. As a charge loss phenomenon occurs, the first program state distribution (1-*a*) moves to the second program state distribution (1-*b*). Thus, a part of the second program state distribution (1-*b*) is located to the left of a verify voltage while the first program state distribution (1-*a*) is located to the right of the verify voltage. When there are more nonvolatile memory cells corresponding to a part (1-*c*) of the second program state distribution (1-*b*), nonvolatile memory cells corresponding to the part (1-*c*) of the second program state distribution (1-*b*) cannot be corrected using an error correction code (ECC).

Figure 8:
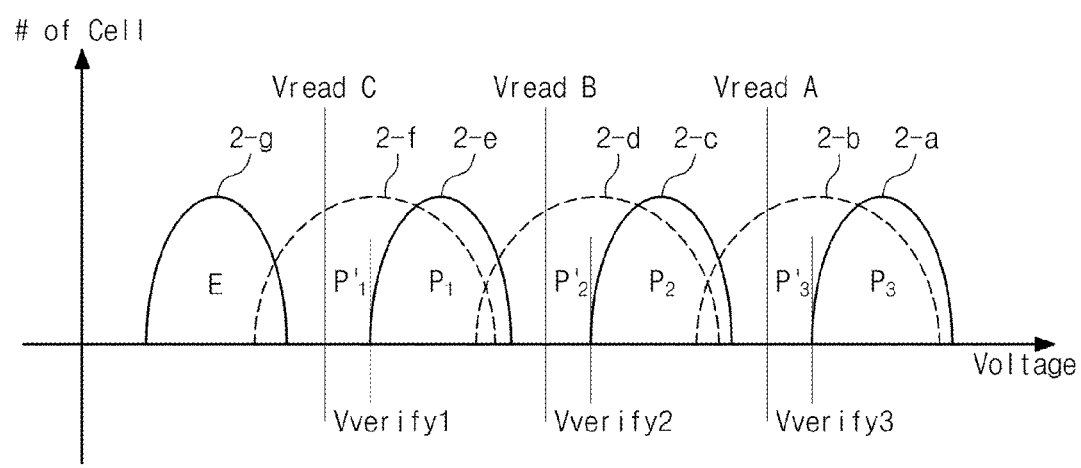
FIG. 8 is a drawing for explaining a charge loss phenomenon of a 2-bit multi level cell (MLC).

FIG. 8 is a drawing for explaining a charge loss phenomenon of a 2-bit multi level cell (MLC). In the case of a MLC nonvolatile memory device, to program k number of bits in one memory cell, any one of 2k number of threshold voltages has to be formed in the memory cell. In the case of storing 2 bits in one memory cell, due to a minute electrical characteristic difference between memory cells, threshold voltages of memory cells in which same data is programmed may form a specific range of a threshold voltage distribution. Each threshold voltage distribution may correspond to a number 2k of data values that may be generated by a number k of bits respectively.

Referring to FIG. 8, in case of a 2 bit MLC nonvolatile memory device, three program threshold voltage states of P1(2-*e*), P2(2-*c*) and P3(2-*a*) which are state distributions immediately after a program operation, and a threshold voltage state distribution of E(2-*g*) which is one erase state, are formed. A charge loss does not occur in P1(2-*e*), P2(2-*c*) and P3(2-*a*) immediately after a program operation and thereby state distributions E(2-*g*), P1(2-*e*), P2(2-*c*) and P3(2-*a*) do not overlap one another. In FIG. 8, a read voltage exists by a state distribution of each threshold voltage. In the case of 2 bits, three read voltages VreadA, VreadB and VreadC are determined. The VreadA, VreadB and VreadC may be default voltages predetermined during a manufacturing process but the inventive concept is not limited thereto. In FIG. 8, for brevity of description, 2 bits were described as an illustration but the inventive concept is not limited thereto. In the case of a 3-bit nonvolatile memory device, 7 program distributions and 1 erase distribution exist and in the case of a 4-bit nonvolatile memory device, 15 program distributions and 1 erase distribution exist.

In the case that time goes by after a 2-bit multi level cell (MLC) nonvolatile memory device performs a program operation and time goes by while a 2-bit multi level cell (MLC) nonvolatile memory device repeatedly performs program and erase operation, due to retention characteristic deterioration of a flash memory cell, threshold voltage distributions of program and erase states may be changed due to a charge loss. The retention characteristic means an ability that a memory cell can continuously preserve stored data without loss of data. In the case that time goes by after data is programmed in a memory cell or time goes by while program and erase operations are repeatedly performed, as a threshold voltage of the memory cell is changed, a retention characteristic is deteriorated.

As described through FIG. 7, in the case of a nonvolatile memory device, as time goes by, a charge loss where electrons trapped in a floating gate or a tunnel oxide layer are emitted occurs with respect to a programmed memory cell. A charge gain which is an opposite concept to the charge loss occurs with respect to a memory cell having an erase state. Herein, the charge gain represents a phenomenon that charges are injected into a floating gate or a tunnel oxide layer of the erased memory cell. A floating gate or a tunnel oxide layer is deteriorated while program and erase operation are repeatedly performed and thereby a charge loss or a charge gain may be further increased.

A charge loss can reduce a threshold voltage of a memory cell, thereby moving a threshold voltage distribution to the left of the drawing. Thus, as illustrated, adjacent threshold voltage distributions may overlap one another. E(2-*g*) and P1'(2-*f*) may overlap from each other, P1'(2-*f*) and P2'(2-D) may overlap from each other and P2'(2-D) and P3'(2-*h*) may overlap from each other. If distributions overlap from one another, when a specific read voltage is applied, data being read may include a lot of errors. For example, when VreadA is applied, if memory cells are in an on state, those indicate read data of P2 side and if memory cells are in an off state, those indicate data of P3 side. However, in the case of an overlapped part, since memory cells of P3 may be read as an on state, an error bit may be incurred. Thus, as threshold distributions overlap one another, a lot of errors may be included in data that has been read.

Due to the nature of a NAND flash memory, if a long period of time goes by after a program of a memory block, a charge loss occurs in programmed memory cells. As described in FIG. 7, since the charge loss moves a threshold voltage of a memory cell to a distribution direction of an erased memory cell, a soft erase phenomenon may be caused. As a result, in a read operation, an error bit level of memory cells increases which are connected to a corresponding memory block or a corresponding word line. If a longer period of time goes by, an ECC circuit goes beyond a correctable error range and thereby an UECC (uncorrectable error correcting code) occurs. To prevent that phenomenon, an operation of lowering an error bit level is needed before an UECC occurs.

To prevent occurrence of a UECC, an operation of moving data of a memory block (source block) deteriorated by a retention characteristic to a fresh block (destination block) is performed in a memory system in advance and that is called a reclaim. If data of a memory block (source block) deteriorated by the retention characteristic moves to a new memory block, data write-requested from a host can be maintained for a long time. That is, by a reclaim process that deteriorated data of a source block is written in a destination block which is a new memory block, data written in memory cells according to a write command can be maintained for a long time without a read error.

However, since an erase count increases due to the use of a fresh memory block, the general reclaim process described above reduces a lifespan of a memory device. Since as a memory block including a plurality of pages storing data in a flash memory device is changed, an address mapping table is also changed, additional program operations occur besides process of a retention block in a reclaim operation. The process of the retention block includes an operation of moving data stored in pages of a block having a deteriorated retention characteristic to a fresh memory block. Since a full page program of programming all the pages in a memory block has to be performed on a destination memory block in a reclaim operation, a long period of processing time is required.

The logical address is an address being used when the memory controller 1200 receives an operation command from a host to store data. The physical address indicates an address that data is actually stored in the memory device 1100. A physical address corresponding to a logical address is mapped in the address mapping table.

In some embodiments of the inventive concept, in the case that a memory cell having an erase state is soft-programmed within a specific range, a memory block itself which becomes a reclaim processing object is reused as it is.

In the case of a NAND flash memory, if data different from programmed data is written in a word line already programmed (i.e., overwrite), a cell threshold voltage of a corresponding word line is corrupted. Thus, due to corruption, data is difficult to be normally read from memory cells connected to that word line. However, if an overwrite operation is performed using data which is the same as the data written in the memory cells connected to the word line already programmed, a corruption of a cell threshold voltage may not occur. Memory cells having a threshold voltage Vth lower than a threshold voltage level (i.e., verify level) that programmed memory cells must have, are programmed once more to have a threshold voltage Vth higher than the verify level. This is called a recharging effect.

In the case that a disturbance is likely to occur by an overwrite operation, if a soft erase operation is performed on programmed memory cells, compensation for the disturbance is done and thereby disturbance problems after the overwrite operation may be solved.

Figure 9:
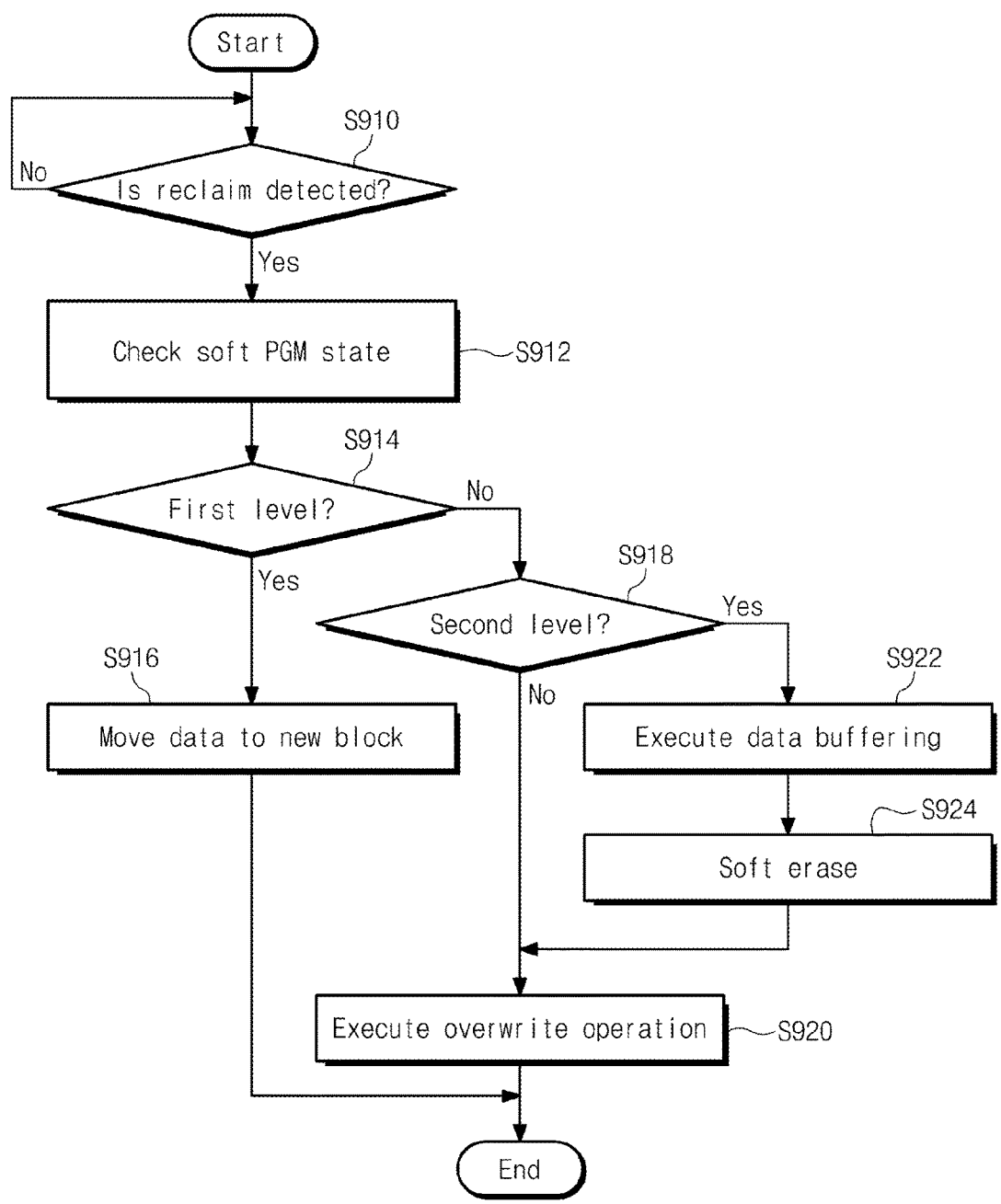
FIG. 9 is a flow chart for explaining a reclaim operation including an overwrite operation according to some embodiments of the inventive concept.
Figure 10:
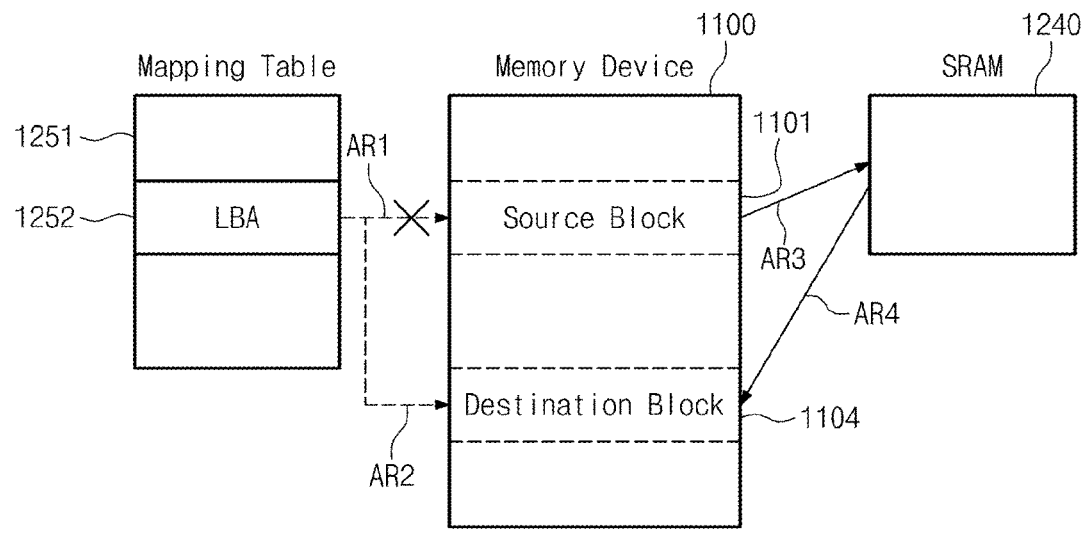
FIG. 10 is a schematic view for explaining an example of a general reclaiming processing method.
Figure 11:
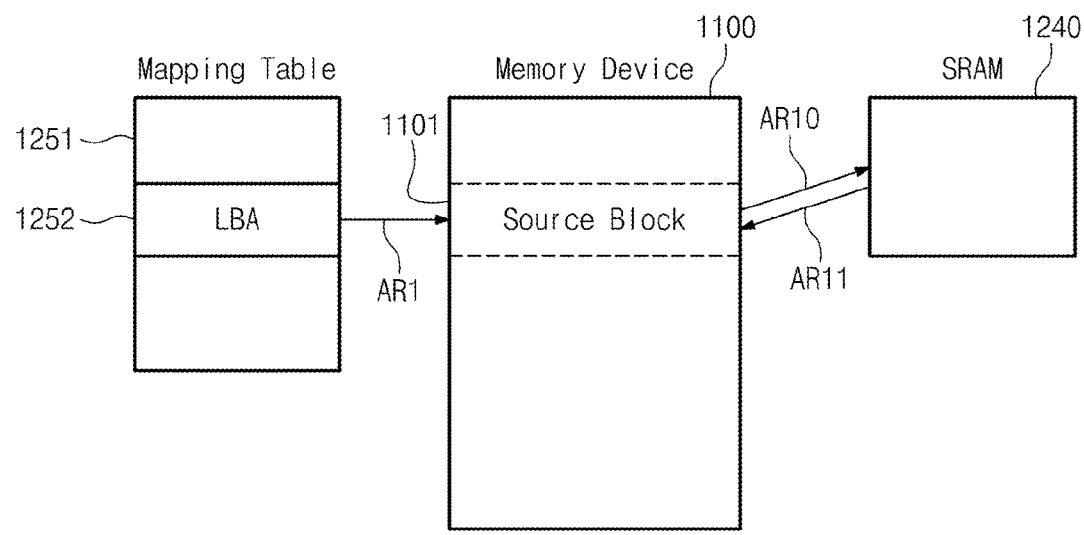
FIG. 11 is a schematic view for explaining an example of a reclaiming method according to some embodiments of the inventive concept.

FIG. 9 is a flow chart for explaining a reclaim operation including an overwrite operation according to some embodiments of the inventive concept. FIG. 10 is a schematic view for explaining an example of a general reclaiming processing method. FIG. 11 is a schematic view for explaining an example of a reclaiming method according to some embodiments of the inventive concept.

Referring to FIG. 9, the memory controller 1200 checks an error bit level through the ECC unit 1260 after reading data of a read-selected memory block. If an error bit level is higher than a set level within a range that does not exceed a UECC level, in a step S910, the memory controller 1200 determines that a reclaim process with respect to deteriorated data is needed.

In a step S912, the memory controller 1200 checks a soft program state level of memory cells having an erase state. In the case that a retention characteristic of programmed memory cells is deteriorated due to a charge loss, a charge gain occurs in memory cells having an erase state. As will be described in FIG. 12, if erase memory cells are soft-programmed due to a charge gain, a distribution of the erase memory cells may change from an erase distribution E1 to an erase distribution E2. In some embodiments of the inventive concept, to determine a soft erase level of the programmed memory cells due to a charge loss, a soft program level of memory cells having an erase state is checked.

In a step S914, if a threshold voltage variation level of the erased memory cells is checked to be a first level (L1 in FIG. 12), a step S916 is performed like FIG. 10 and thereby a general reclaim process is performed. Referring to FIG. 10, as indicated through an arrow AR3, deteriorated data in a source block 1101 of the memory device 1100 is stored in a SRAM 1240 that functions as a buffer for a reclaim process. As indicated through an arrow AR4, data (error corrected data) stored in the SRAM 1240 moves a destination block 1104 which s a fresh memory block. In a general reclaim process, when an address map region 1252 of the mapping table 1251 is changed, a selection path indicated through an arrow AR1 is changed to a selection path indicated through an arrow AR2 and in a memory operation after that, the destination block 1104 may be selected without selection of the source block 1101.

In a step S918, if a threshold voltage variation level of memory cells having an erase state is checked to be a third level (L3 in FIG. 12) lower than a second level (L2 in FIG. 12), a step S920 is performed like FIG. 11 and an overwrite operation is performed which overwrites read data in a memory block which becomes a reclaim process target as it is.

Referring to FIGS. 10 and 11, deteriorated data in the source block 1101 of the memory device 1100 is stored in the SRAM 1240 that functions as a buffer for a reclaim process as indicated through an arrow AR10. Data (error corrected data) stored in the SRAM 1240 is overwritten in the source memory block 1101 which becomes a reclaim process target as indicated through an arrow AR11. Since in a reclaim process having the overwrite operation, a mapping of a logical address to a physical address is not changed, the address map region 1252 of the mapping table 1251 does not need to be changed. Therefore, since a memory controller does not need an operation of changing a physical address corresponding to a logical address in the mapping table in an overwrite operation, the time it takes to process a reclaim may be reduced.

In the step S918, if a threshold voltage variation level of memory cells having an erase state is checked to be a second level (L2 in FIG. 12) lower than a first level (L1 in FIG. 12), the step S920 is performed after steps S922 and S924 are sequentially performed. If after data is buffered in a buffer in the step S922, a soft erase is performed on memory cells programmed in the step S924, disturbance problems that may occur in memory cells being overwritten are solved.

In the case that a threshold voltage variation level of memory cells having an erase state is checked to be a second level (L2 in FIG. 12) lower than a first level (L1 in FIG. 12), before an overwrite operation, a soft erase operation is performed to move a threshold voltage distribution of memory cells to an erase cell distribution direction or to narrow a threshold voltage distribution of memory cells.

A soft erase may have the same bias condition as a normal erase except that a weak erase voltage lower than an erase voltage is applied to a bulk region. That is, 0V is applied to all the word lines of a block selected when a soft erase operation is performed and a weak erase voltage of about 20V may be applied to only a bulk region. Thus, in program memory cells on which a soft erase is performed, disturbance problems of memory cells overwritten after the overwrite operation may be prevented or reduced.

Figure 12:
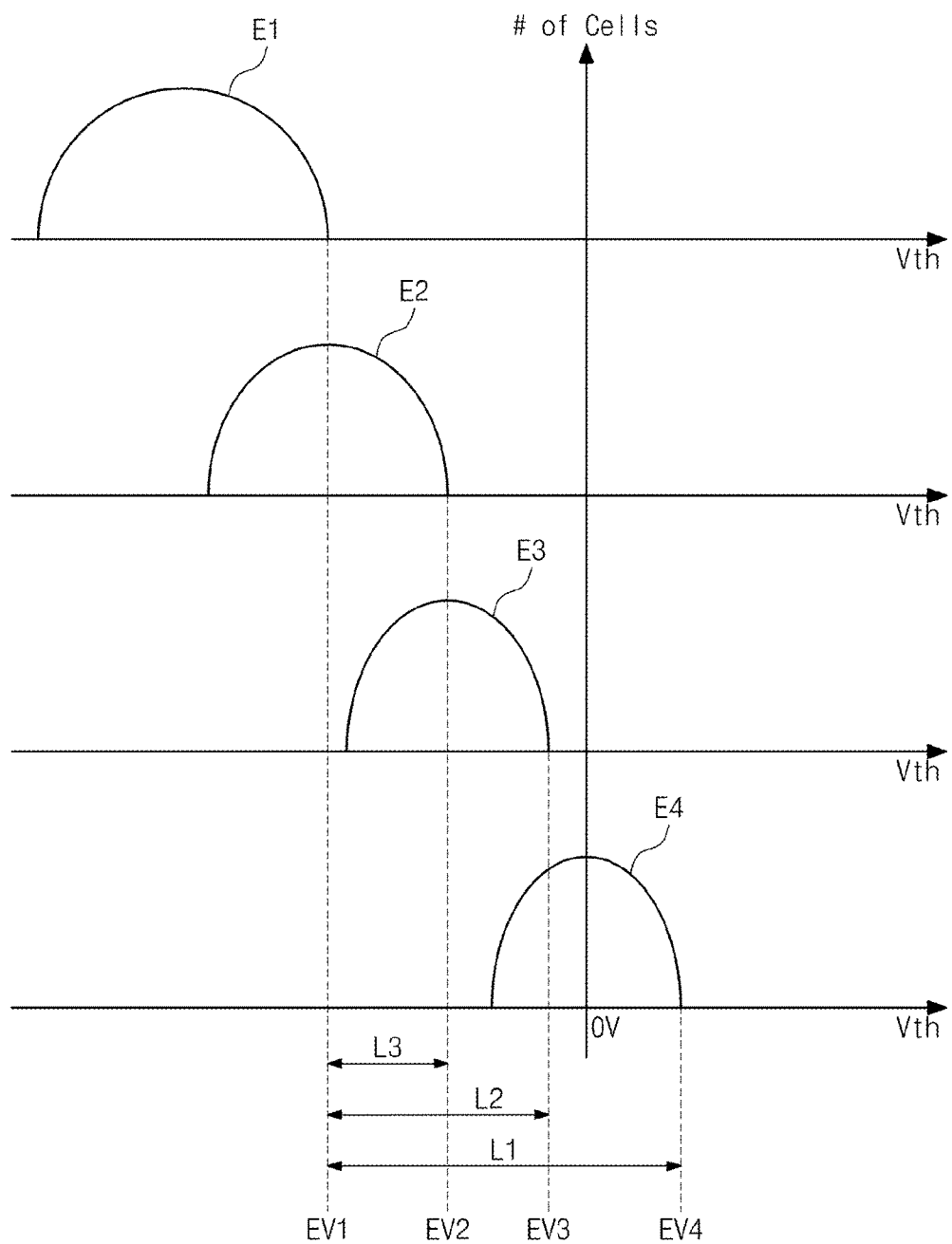
FIG. 12 is a drawing illustrating judgment of a soft program state level in a reclaiming operation in accordance with FIG. 9.

FIG. 12 is a drawing illustrating a determination of a soft program state level in a reclaiming operation in accordance with FIG. 9. Referring to FIG. 12, a horizontal axis represents a threshold voltage and a vertical axis represents the number of memory cells. To decide an overwrite operation, in some embodiments of the inventive concept, a charge loss level of program memory cells is determined by checking a soft program state level of memory cells having an erase state due to a charge gain. This is because in the case that a retention characteristic of the programmed memory cells is deteriorated due to a charge loss, a charge gain occurs in memory cells having an erase state. A threshold voltage distribution of erase memory cells may be changed from an original erase distribution E1 to an erase distribution E2 by a charge gain. If changing from an original erase distribution E1 to an erase distribution E2 is called a first setting range, the first setting range corresponds to a third level L3 in FIG. 12. The first setting range exists between erase threshold voltages EV1 and EV2. In the case that memory cells having an erase state is within the first setting range, an overwrite operation is performed on programmed memory cells.

If changing from an original erase distribution E1 to an erase distribution E3 is called a second setting range, the second setting range corresponds to a second level L2 in FIG. 12. The second setting range exists between erase threshold voltages EV1 and EV3. In the case that memory cells having an erase state is within the second setting range, an overwrite operation is performed on programmed memory cells after a soft erase operation.

If changing from an original erase distribution E1 to an erase distribution E4 is called a third setting range, the third setting range corresponds to a first level L1 in FIG. 12. The third setting range exists between erase threshold voltages EV1 and EV4. In the case that memory cells having an erase state is within the third setting range, an overwrite operation with respect to programmed memory cells is not performed and a general reclaim operation is performed.

Figure 13:
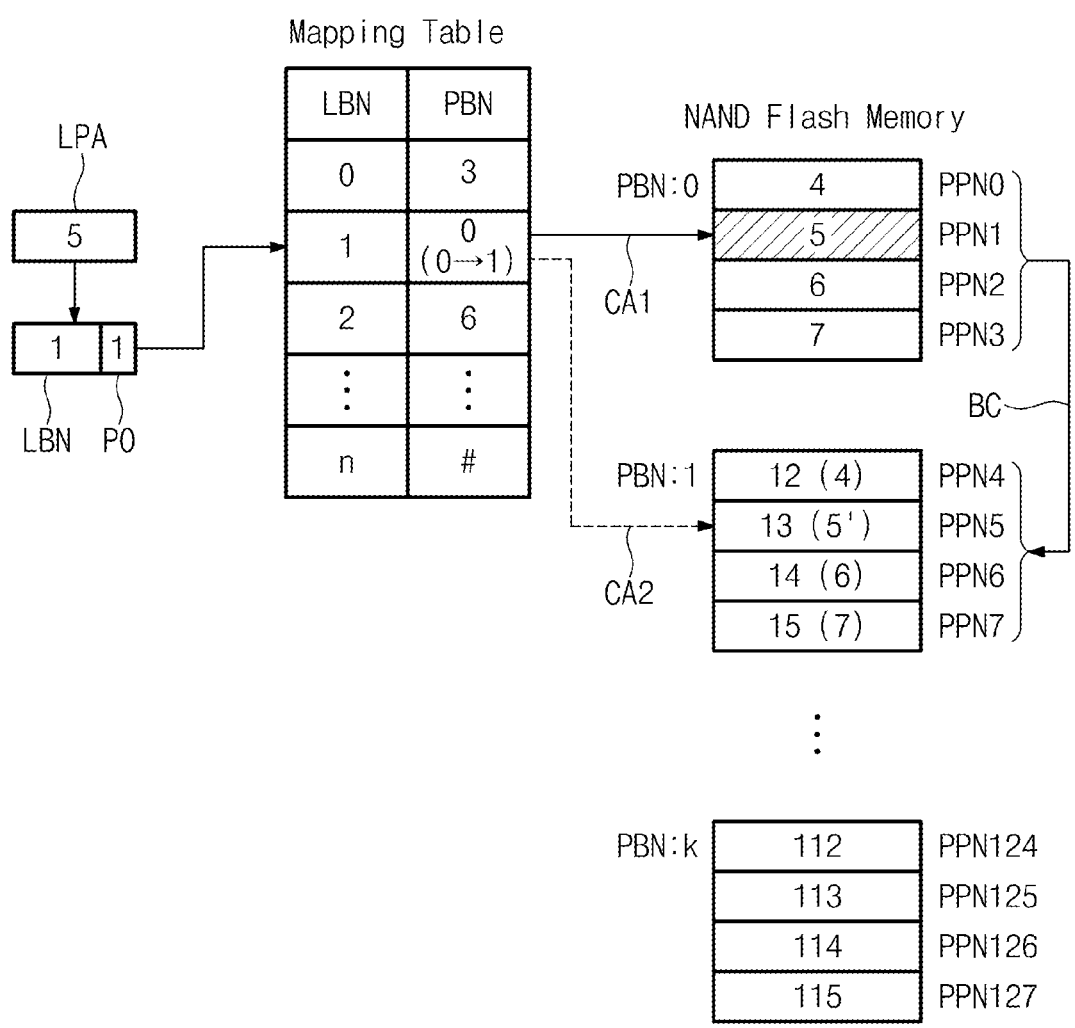
FIG. 13 is a drawing illustrating a mapping of a mapping table in an overwrite operation according to the inventive concept.

FIG. 13 is a drawing illustrating a mapping of a mapping table in an overwrite operation according to the inventive concept. A mapping table may be managed by a FTL (flash translation layer) that functions as a device driver of a memory controller. A block level mapping scheme that can reduce a page map table size among various mapping schemes is illustrated in FIG. 13. A memory block of a NAND flash memory is divided into physical block numbers (PNB:0~PNB:k) and a page offset in each PBN is 0~3. A physical number PBN corresponding to a logical block number LBN is mapped in the mapping table.

For example, if in a write operation, a logical page address LPA is applied to a memory controller as LPA=5, the LPA 5 is divided by a set page offset value 4 to become 5/4=1. Accordingly, LBN becomes 1 and a page offset P0 becomes 1. Since in the mapping table, LBN 1 is mapped as a physical block number PBN 0 and a page offset is 1, program data is stored in a second page PPN1 of a physical page number (PBN:0) of a NAND flash memory along a mapping path CA1 as illustrated.

In the case of an overwrite operation in some embodiments of the inventive concept, since data read from the second page PPN1 is written in the second page PPN1 again, a mapping relation of LBN1 and PBN 0 remains the same in the mapping table. In a reclaim process in which data moves to a flash memory block, a mapping relation is changed to LBN 1: PBN 1 in the mapping table as illustrated. In the reclaim process, data is newly stored in a second page PPN5 of a physical block number (PBN:1) along a changed mapping path CA2 as illustrated. Data stored in the physical block number (PBN:0) is block-copied to the changed physical block number (PBN:1) as illustrated through a block copy BC.

In some embodiments of the inventive concept, an overwrite characteristic of a NAND flash memory is used in a reclaim process. In the case that an error bit level of a specific memory block is increased by a retention or disturbance, an error bit level is lowered by overwriting data which is the same as data written in memory cells connected to a read word line in memory cells connected to the word line.

A reclaim process through an overwrite operation can reduce the number of uses of a fresh memory block and thereby a lifespan of a NAND flash memory device may be extended. Since a mapping information change about a physical address with respect to a logical address is not needed, a mapping table management operation does not occur. Thus, a reclaim processing speed may also be increased.

Figure 14:
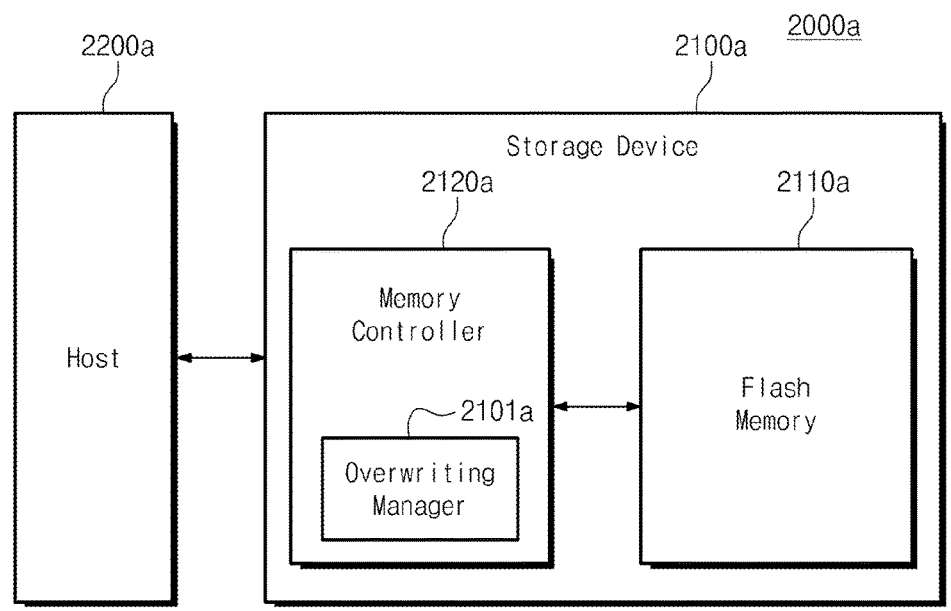
FIGS. 14 and 15 are block diagrams illustrating various application examples of a memory system according to the inventive concept.
Figure 15:
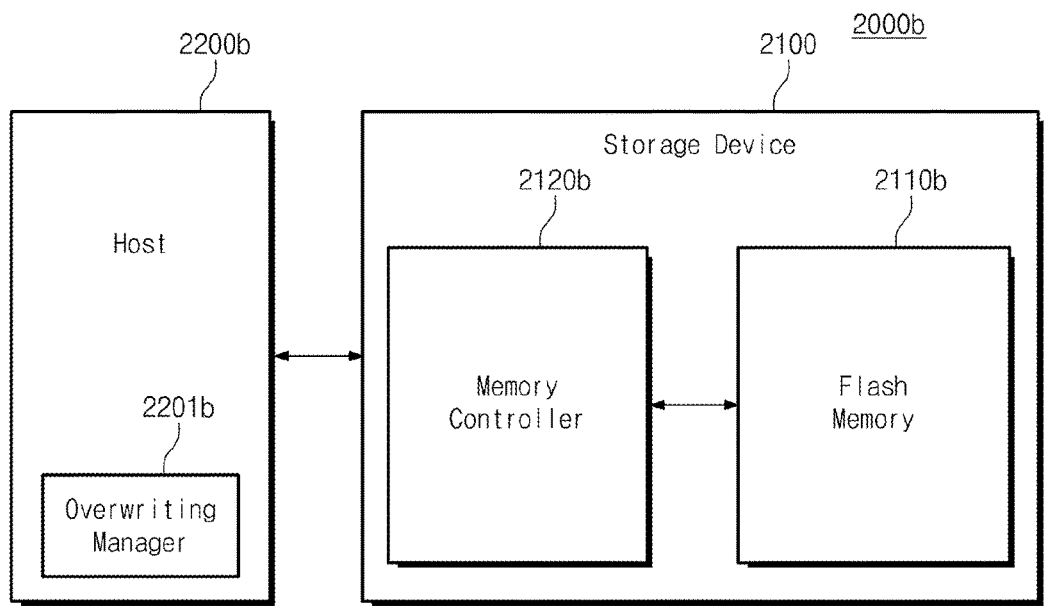

FIGS. 14 and 15 are block diagrams illustrating various application examples of a memory system according to the inventive concept. Referring to FIGS. 14 and 15, a memory system (2000a, 2000b) includes a storage device (2100a, 2100b) and a host (2200a, 2200b). The storage device (2100a, 2100b) may include a flash memory (2100a, 2110b) and a memory controller (2120a, 2120b).

The storage device (2100a, 2100b) may include a memory card (e.g., SD, MMC, etc.) or a storage medium such as a detachable mobile storage device (e.g., USB memory). The storage device (2100a, 2100b) may be connected to the host (2200a, 2200b). The storage device (2100a, 2100b) exchanges data with the host through a host interface. The storage device (2100a, 2100b) can be supplied with power from the host (2200a, 2200b) to perform an internal operation.

In the case of FIG. 14, the memory controller 2120a includes an overwriting manager 2101a controlling an overwrite operation in a reclaim operation. In the case of FIG. 15, the host 2200b includes an overwriting manager 2201b controlling an overwrite operation in a reclaim operation. The overwriting manager can control an overwrite operation in a reclaim operation according to an operation control flow of FIG. 9. Thus, a lifespan of the storage device (2100a, 2100b) is extended and an operation speed in a reclaim process is increased.

Figure 16:
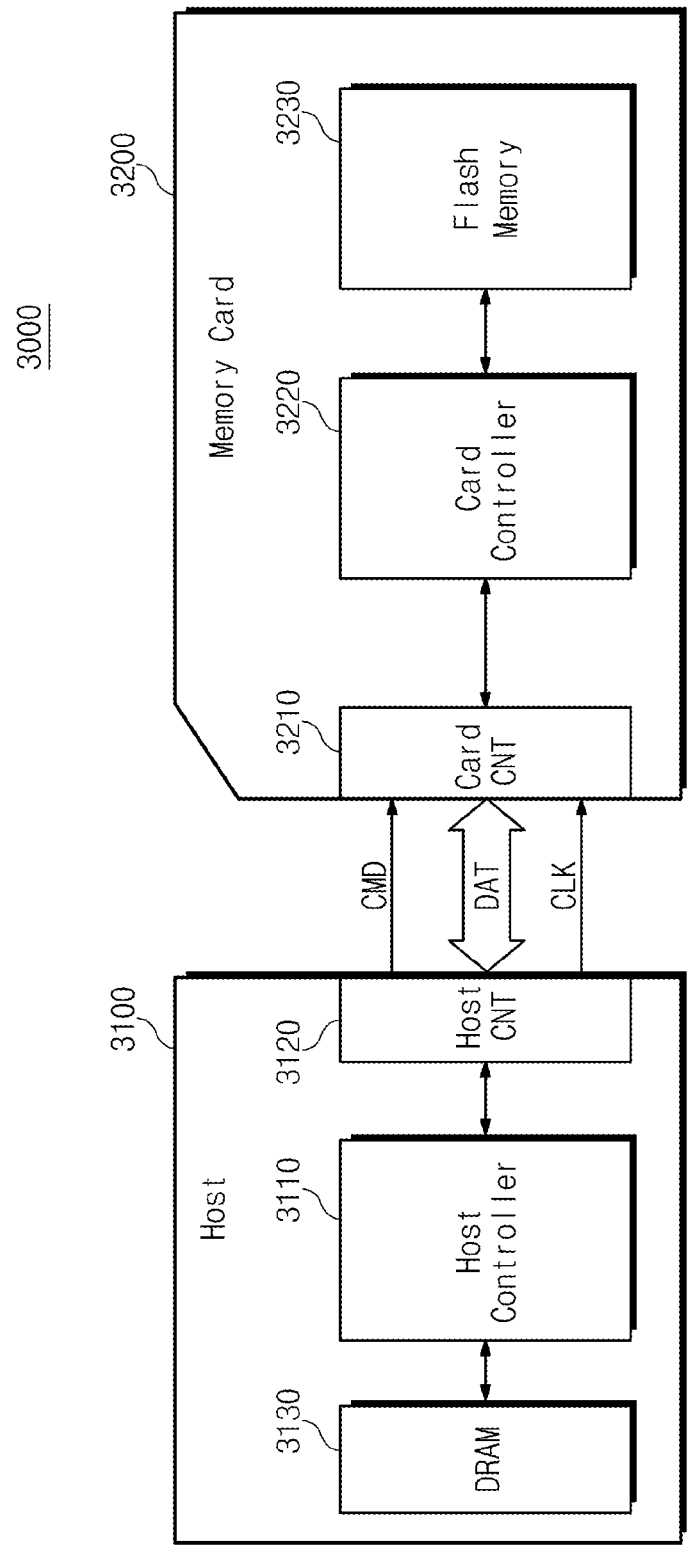
FIG. 16 is a block diagram illustrating an example of a memory card system including a memory system according to some embodiments of the inventive concept.

FIG. 16 is a block diagram illustrating an example of a memory card system including a memory system according to some embodiments of the inventive concept. Referring to FIG. 16, a memory card system 3000 includes a host 3100 and a memory card 3200. The host 3100 includes a host controller 3110, a host connection unit 3120 and a DRAM 3130.

The host 3100 writes data in the memory card 3200 or reads data stored in the memory card 3200. The host controller 3110 transmits a command (e.g., a write command), a clock signal CLK generated from a clock generator in the host 3100 and data DATA to the memory card 3200 through the host connection unit 3120. The DRAM 3130 is a main memory of the host 3100.

The memory card 3200 may include a card connection unit 3210, a card controller 3220 and a flash memory 3230. The card controller 3220 stores data in the flash memory 3230 in synchronization with a clock signal CLK generated from a clock generator in the card controller 3220 in response to a write command received through the card connection unit 3210. The flash memory 3230 stores data transmitted from the host 3100. In the case that the host 3100 is a digital camera, the flash memory stores image data.

The memory card system 3000 may include an overwriting manager in the host controller 3110, the card controller 3220 and the flash memory 3230. As described above, by including an overwriting manager, a management operation of a mapping table is not needed while a system lifespan is maximized or extended. As a result, a reclaim processing speed is increased.

Figure 17:
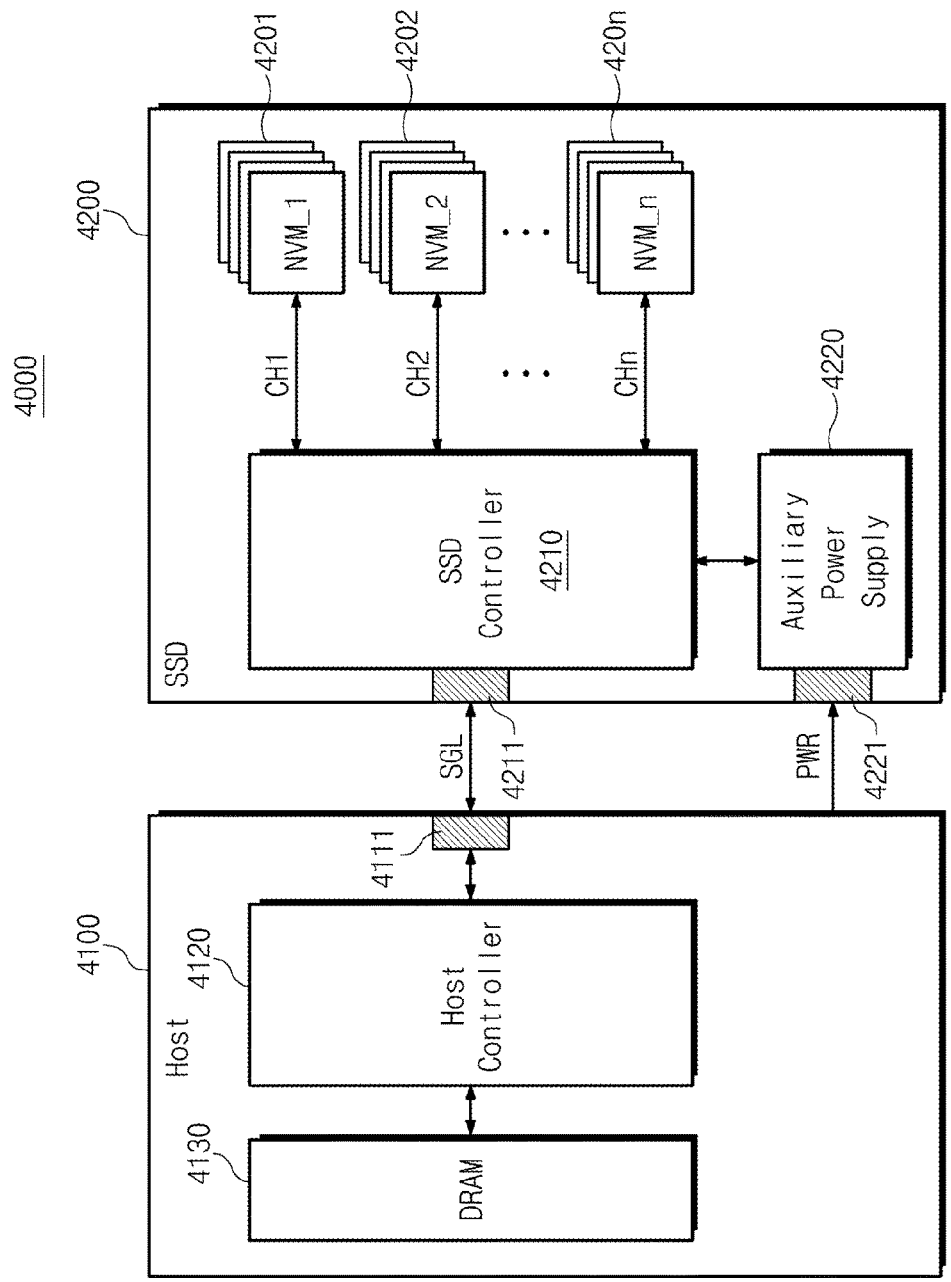
FIG. 17 is a block diagram illustrating an example of a solid state drive (SSD) system including a memory system according to some embodiments of the inventive concept.

FIG. 17 is a block diagram illustrating an example of a solid state drive (SSD) system including a memory system according to some embodiments of the inventive concept. Referring to FIG. 17, a SSD system 4000 includes a host 4100 and a SSD 4200. The host 4100 includes a host interface 4111, a host controller 4120 and a DRAM 4130. The host 4100 writes data in the SSD 4200 or reads data stored in the SSD 4200. The host controller 4120 transmits a signal SGL such as a command, an address, a control signal, etc. to the SSD 4200 through the host interface 4111. The DRAM 4130 functions as a main memory of the host 4100.

The SSD 4200 exchanges a signal with the host 4100 through a signal connector 4211 and is inputted with power through a power connector 4221. The SSD 4200 may include a plurality of flash memories 4201~420n, a SSD controller 4210 and an auxiliary power supply 4220. The flash memories 4201~420n may be embodied by PRAM, MRAM, ReRAM, FRAM, etc. besides a NAND flash memory.

The flash memories 4201~420n are used as a storage medium of the SSD 4200. The flash memories 4201~420n can be connected to the SSD controller 4210 through a plurality of channels CH1~CHn. One or more nonvolatile memories can be connected to each channel. Nonvolatile memories connected to each channel can be connected to a same data bus.

The SSD controller 4210 exchanges a signal SGL with the host 4100 through the signal connector 4211. The signal SGL includes a command, an address, data, etc. The SSD controller 4210 writes data in a corresponding nonvolatile memory or reads data from a corresponding nonvolatile memory according to a command of the host 4100.

The auxiliary power supply 4220 is connected to the host 4100 through the power connector 4221. The auxiliary power supply 4220 can receive power PWR from the host 4100 to charge it. The auxiliary power supply 4220 can be located inside or outside the SSD 4200. For example, the auxiliary power supply 4220 is located on a main board and can provide auxiliary power to the SSD 4200.

Figure 18:
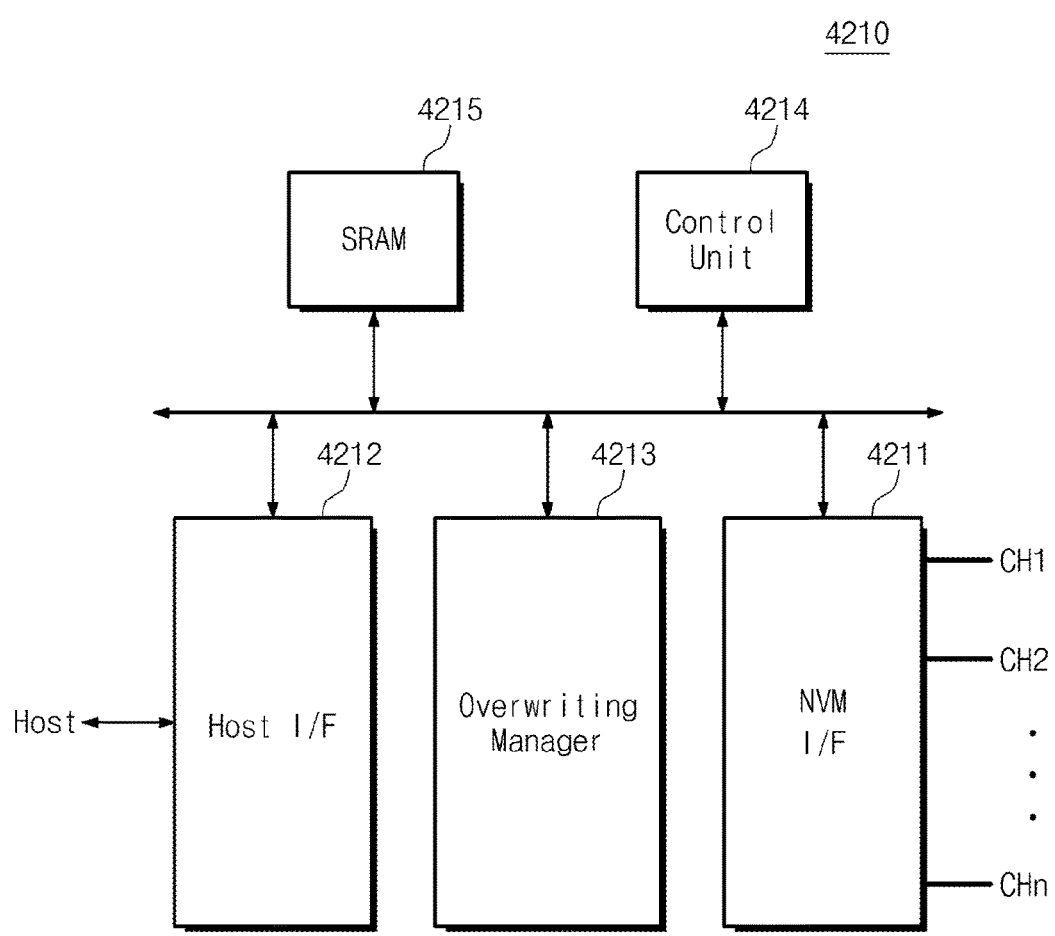
FIG. 18 is a block diagram illustrating a controller of the solid state drive (SSD) system illustrated in FIG. 17.

FIG. 18 is a block diagram illustrating a structure of the solid state drive (SSD) system illustrated in FIG. 17. Referring to FIG. 18, the SSD controller 4210 includes a NVM interface 4211, a host interface 4212, an overwriting manager 4213, a control unit 4214 and a SRAM 4215.

The NVM interface 4211 scatters data transmitted from a main memory of the host 4100 on respective channels CH1~CHn. The NVM interface 4211 transmits data read from the nonvolatile memories 4201~420n to the host 4100 via the host interface 4212. The host interface 4212 provides an interface with the SSD 4200 in response to a protocol of the host 4100. The host interface 4212 can communicate with the host 4100 using a universal serial bus (USB), a small computer system interface (SCSI), a PCI express, an ATA, a parallel ATA (PATA), a serial ATA (SATA), a serial attached SCSI (SAS), etc. The host interface 2212 can perform a disk emulation function of supporting so that the host 4100 recognizes the SSD 4200 as a hard disk drive (HDD).

The overwriting manager 4213 can control an overwrite operation in a reclaim operation of a nonvolatile memories 4201~420*n* as described above. The control unit 4213 analyzes and processes a signal SGL received from the host 4100. The control unit 4213 controls the host 4100 or the nonvolatile memories 4201~420*n* through the host interface 4212 or the NVM interface 4211. The control unit 4213 controls an operation of the nonvolatile memories 4201~420*n* according to a firmware for driving the SSD 4200. A function of the overwriting manager 4213 may be merged with the control unit 4214.

The SRAM 4214 can be used to drive software (S/W) being used for an efficient management of the nonvolatile memories 4201~420*n*. The SRAM 4214 can store meta-data received from a main memory of the host 4100 or stores cache data. In a sudden power off operation, meta-data or cache data stored in the SRAM 4214 can be stored in the nonvolatile memories 4201~420*n* using the auxiliary power supply 4220.

The SSD system 4000 can reduce a read error that occurs due to a disturbance phenomenon of the nonvolatile memories 4201~420*n* in a read operation by performing an overwriting function in the reclaim operation. In this case, a product life is extended and a reclaim processing speed is improved.

Figure 19:
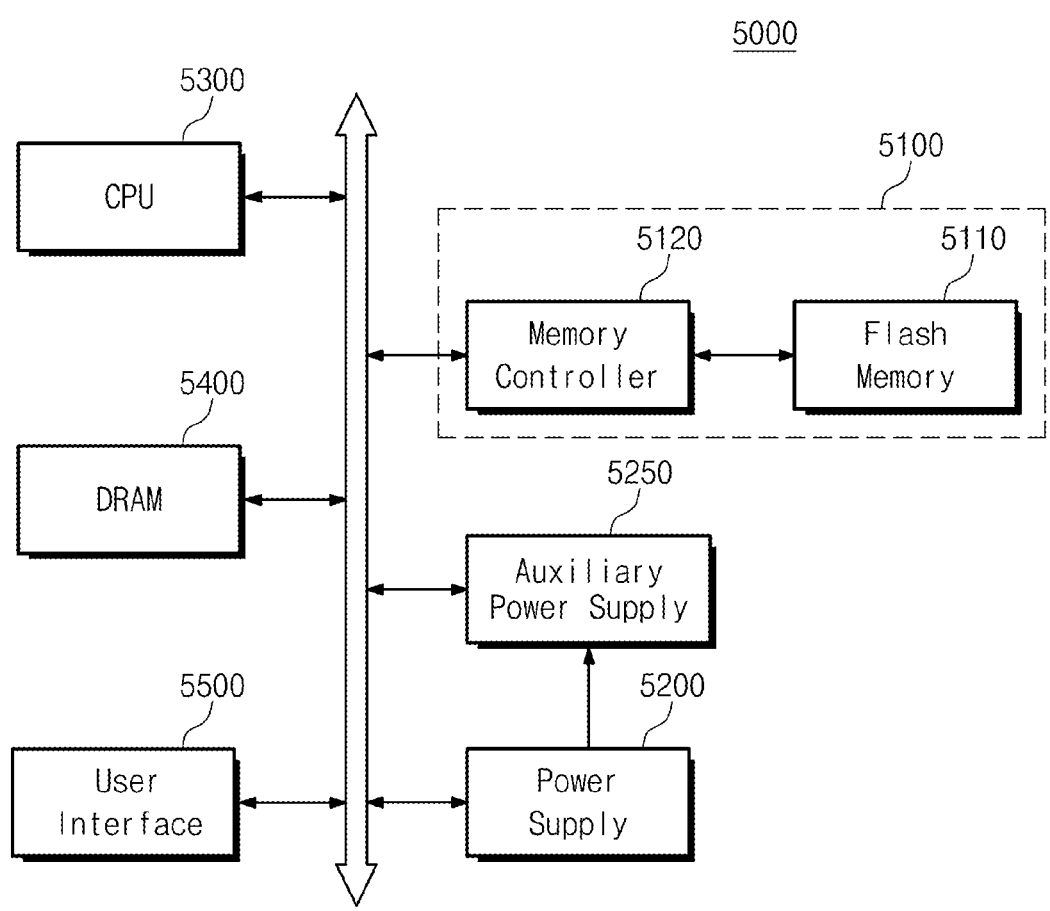
FIG. 19 is a block diagram illustrating an example of a memory system according to some embodiments of the inventive that is embodied by an electronic device.

FIG. 19 is a block diagram illustrating an example where a memory system according to some embodiments of the inventive is embodied by an electronic device. An electronic device 5000 may be provided as one of various constituent elements such as a computer, an ultra mobile PC (UMPC), a workstation, a net-book, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a three dimensional television, a smart television, a digital audio recorder, a digital audio player, a digital picture recorder, a digital picture player, a digital video recorder, a digital video player, a storage constituting a data center, a device that can transmit and receive information in a wireless environment, one of various electronic devices constituting a home network, one of various electronic devices constituting a computer network, one of various electronic devices constituting a telematics network, and one of various constituent elements constituting a RFID device or a computing system.

Referring to FIG. 19, the electronic device 5000 includes a memory system 5100, a power supply 5200, an auxiliary power supply 5250, a central processing unit 5300, a DRAM 5400, and a user interface 5500. The memory device 5100 includes a flash memory 5110 and a memory controller 5120. The memory device 5100 can be built in the electronic device 5000. As described above, the electronic device 5000 can effectively reduce a read error occurring due to a disturbance phenomenon of the flash memory 5110 by executing an overwrite operation.

According to a structure of some embodiments of the inventive concept, since the number of uses of a new memory block is reduced through an overwrite operation, lifespan of a memory device is extended. Since a reclaim process is performed on deteriorated data without change of a mapping table, a reclaim processing speed increases.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of controlling a nonvolatile memory device having a plurality of memory blocks including a plurality of memory cells stacked in a direction perpendicular to a substrate, the method comprising:
   reading data of memory cells connected to a word line of a selected memory block;
   determining a need of reclaim based on an error bit level of the read data; and
   checking a soft program state level with respect to the memory cells connected to the word line, and then performing an overwrite operation including overwriting the read data in the memory cells connected to the word line of the selected memory block in the case that it is determined that the soft program state level does not go beyond a first setting range.

2. The method of controlling a nonvolatile memory device of claim 1, wherein a read of the soft program state is performed on memory cells having an erase state among the memory cells connected to the word line.

3. The method of controlling a nonvolatile memory device of claim 1, further comprising, in the case that it is determined that the soft program state level goes beyond the first setting range and exists in a second setting range, soft-erasing the memory cells connected to the word line before overwriting the read data.

4. The method of controlling a nonvolatile memory device of claim 3, further comprising, in the case that the soft program state level goes beyond the second setting range, writing the read data in a different memory block from the selected memory block.

5. The method of controlling a nonvolatile memory device of claim 1, wherein in the overwrite operation, the read data being overwritten in the memory cells is error corrected data.

6. The method of controlling a nonvolatile memory device of claim 1, wherein the nonvolatile memory device comprises a memory cell array defining a three-dimensional NAND flash memory device.

7. The method of controlling a nonvolatile memory device of claim 1, wherein the overwrite operation is performed by a full page program of a memory block unit.

8. The method of controlling a nonvolatile memory device of claim 1, wherein the overwrite operation is performed by a full page program of a word line unit.

9. The method of controlling a nonvolatile memory device of claim 1, wherein the memory cells comprise multi-level cells storing two or more bits.

10. The method of controlling a nonvolatile memory device of claim 1, wherein an error bit level of the read data, when determining the need of reclaim, is within the error correcting code (ECC) error correctable range.

11. A method of controlling a nonvolatile memory device having a plurality of memory blocks including a plurality of memory cells stacked in a direction perpendicular to a substrate, the method comprising:
    reading data written in memory cells connected to a word line of a first memory block;

determining a need of reclaim based on an error bit level of the read data;

checking a soft program state level with respect to memory cells having an erase state among memory cells connected to the word line, and then performing an overwrite operation by directly overwriting the read data in the memory cells connected to the word line of the first memory block in the case that it is determined that the soft program state level is within a first setting range; and writing the read data in a second memory block different from the first memory block in the case that it is determined that the soft program state level goes beyond the first setting range.

12. The method of controlling a nonvolatile memory device of claim 11, further comprising, in the case that it is determined that the soft program state level does not go beyond a first setting range by a specific range and is within the specific range, performing a soft erase operation before overwriting the read data in the memory cells.

13. The method of controlling a nonvolatile memory device of claim 11, wherein in the overwrite operation, the data being stored in the memory cells is error corrected data.

14. The method of controlling a nonvolatile memory device of claim 11, wherein in the overwrite operation, the read data is overwritten in the memory cells connected to the word line of the first memory block as it is, and a mapping table of mapping a physical address corresponding to a logical address of the first memory block remains unchanged.

15. The method of controlling a nonvolatile memory device of claim 11, wherein in a reclaim process of writing the read data in a second memory block different from the first memory block, as the read data moves to the second memory block different from the first memory block, a mapping table of mapping a physical address corresponding to a logical address of the first memory block is changed.

16. A memory system comprising:
a nonvolatile memory device having a plurality of memory blocks including a plurality of memory cells stacked in a direction perpendicular to a substrate; and
a memory controller having an overwriting manager;
wherein when data stored in memory cells connected to a selected word line of one memory block of the memory blocks is read to the memory controller and it is determined that an error bit level of the read data needs a reclaim and if a soft program state level of the memory cells connected to the word line is checked and it is determined that the soft program state level is within a specific range, the overwriting manager controls the read data to be overwritten in the memory cells connected to the word line of the selected memory block.

17. The memory system of claim 16, wherein checking the soft program state level is performed on memory cells having an erase state among memory cells connected to the word line; and wherein the overwriting manager performs overwriting on memory cells having a program state among memory cells connected to the word line.

18. The memory system of claim 16, wherein the data being overwritten in the memory cells is data error-corrected by an error correction code (ECC) decoding operation.

19. The memory system of claim 16, wherein when the soft program state level is out of a specific range as a result of the check, the read data is written in a fresh memory block different from the selected memory block.

20. The memory system of claim 16, wherein in the case that the memory cells are multi level cells storing two or more bits, the overwrite operation includes performing a last page program on a word line of the memory cells.

* * * * *